United States Patent [19]

MacDiarmid et al.

[11] 4,321,114

[45] Mar. 23, 1982

[54] ELECTROCHEMICAL DOPING OF CONJUGATED POLYMERS

[75] Inventors: Alan G. MacDiarmid, Drexel Hill; Alan J. Heeger, Wynnewood; Paul J. Nigrey, Philadelphia, all of Pa.

[73] Assignee: University Patents, Inc., Norwalk, Conn.

[21] Appl. No.: 129,439

[22] Filed: Mar. 11, 1980

[51] Int. Cl.$^3$ .......................................... H01M 10/44
[52] U.S. Cl. ................................... 204/2.1; 204/291; 204/131; 429/50; 429/213; 429/199
[58] Field of Search ................. 429/212, 50, 213, 199; 204/131, 2.1, 291, 165

[56] References Cited

U.S. PATENT DOCUMENTS

| | | | |
|---|---|---|---|
| 3,352,720 | 11/1967 | Wilson et al. | 429/213 |
| 3,764,385 | 10/1973 | Langer, Jr. et al. | 429/213 X |
| 3,804,675 | 4/1974 | Hill | 429/213 X |
| 3,881,957 | 5/1975 | Hausler | 429/212 X |
| 3,971,748 | 7/1976 | Wang et al. | 429/212 X |
| 3,993,501 | 11/1976 | Kalnoki-Kis | 429/212 X |
| 4,128,702 | 12/1978 | Okamiva | 429/213 X |
| 4,181,779 | 1/1980 | Teo | 429/213 X |
| 4,182,797 | 1/1980 | Kondo et al. | 429/213 X |
| 4,182,798 | 1/1980 | Skarstad | 429/213 |

*Primary Examiner*—Charles F. LeFevour
*Attorney, Agent, or Firm*—Jerome M. Teplitz; David N. Koffsky; A. Sidney Alpert

[57] ABSTRACT

Conjugated polymers are doped with dopant ions to a preselected room temperature electrical conductivity ranging from that characteristic of semiconductor behavior to that characteristic of metallic behavior, by means of an electrochemical procedure wherein the polymer is employed as one or both of the electrodes of an electrolytic cell, including as the electrolyte a compound which is ionizable into the dopant ions. Upon electrolysis of the electrolyte, the polymer, if used as the anode, becomes doped with anionic dopant ions to a p-type material; or if used as the cathode, becomes doped with cationic dopant ions to an n-type material.

The above-described electrochemical doping procedure finds particularly useful application in the charging of novel secondary batteries in which a doped conjugated polymer is employed as one or both of the electrodes. Such secondary batteries, in their charged state, comprise a metal whose Pauling electronegativity value is no greater than 1.6, or a conjugated polymer doped with dopant cations of said metal, as the anode-active material; a conjugated polymer doped with dopant anions as the cathode-active material; and a compound which is ionizable into the dopant ions as the electrolyte. In the initial discharged state of such secondary batteries, the polymer is in undoped form, and charging of the battery is effected by electrochemical doping of the polymer with the dopant ions of the electrolyte.

28 Claims, No Drawings

ELECTROCHEMICAL DOPING OF CONJUGATED POLYMERS

The Government has rights in this invention pursuant to Contract No. N00014-75-C-0962 awarded by the Office of Naval Research.

BACKGROUND OF THE INVENTION

This invention relates to an electrochemical doping procedure for the selective modification of the room temperature electrical conductivity properties of conjugated polymers and to the application of such procedure in the design of novel high energy density secondary batteries.

For use in a wide variety of electrical and electronic device applications, it is highly desirable to have available electrically conducting materials having a preselected room temperature electrical conductivity varying over a broad range extending from slightly conducting to highly conducting. Furthermore, particularly for use in semiconductor device applications, requiring one or more p-n junctions, such materials should advantageously be available with both p-type and n-type electrical conductivities.

It has recently been found that semiconducting acetylene polymers, such as polyacetylene, can be chemically doped in a controlled manner with electron acceptor and/or electron donor dopants to produce a whole family of p-type and n-type electrically conducting doped acetylene polymers whose room temperature electrical conductivity may be preselected over the entire range characteristic of semiconductor behavior and into the range characteristic of metallic behavior. Such doping procedures and the resulting doped acetylene polymers are described and claimed in the commonly assigned U.S. patent application Ser. No. 902,667, of Alan J. Heegar, Alan G. MacDiarmid, Chwan K. Chiang, and Hideki Shirakawa, filed on May 4, 1978 now U.S. Pat. No. 4,222,903; and in the commonly assigned U.S. patent application Ser. No. 902,666, of Alan J. Heeger, Alan G. MacDiarmid, Chwan K. Chiang, and Shek-Chung Gau, also filed on May 4, 1978 now U.S. Pat. No. 4,204,216; both of said applications being incorporated herein by reference. As described in said Heeger, et al. applications, a p-type material is obtained with electron acceptor dopants, and an n-type material is obtained with electron donor dopants. The resulting room temperature electrical conductivity of the doped acetylene polymer increases with increasing degree of doping up to a certain point at which the maximum conductivity is obtained for any given dopant, such maximum conductivity generally being obtained at a degree of doping not greater than about 0.30 mol of dopant per —CH— unit of the polyacetylene.

The doping procedures described in said Heeger, et al. applications involve merely contacting the acetylene polymer with the dopant, which may be either in the vapor phase or in solution, whereby uptake of the dopant into the acetylene polymer occurs by chemical reaction to a degree proportional with both the dopant concentration and the contacting period, such concentration and contacting period being coordinated and controlled so that the corresponding degree of doping will be such as to provide the resulting doped acetylene polymer with the preselected room temperature electrical conductivity. While such doping procedures are generally effective for achieving the desired result, they are subject to certain limitations. First of all, it is rather difficult with these procedures to obtain a reliably precise control of the degree and uniformity of doping so as to ensure commercial scale production of a doped polymer product with a consistent and uniform room temperature electrical conductivity. Secondly, the fact that these procedures require a doping material which is chemically reactive with the acetylene polymer is a limiting factor in the selection of doping materials which are economically attractive. Thirdly, these procedures require the use of two totally different doping materials and, consequently, separate doping systems for carrying out p-type and n-type doping. Hence, the development of more efficient and economical doping procedures would greatly enhance the commercial attractiveness of doped acetylene polymers as substitutes for the more conventional electrically conductive materials.

Doped acetylene polymers constitute one class of recently developed molecular solids exhibiting relatively high levels of electrical conductivity. Several of these other molecular solids have previously been investigated as electrode materials in attempts at improved battery design. For example, the Moser U.S. Pat. No. 3,660,163, issued May 2, 1972, and Schneider, et al., *Proc. Int. Power Sources Conf.*, 651–659 (1974), describe the use of a charge transfer complex of iodine and poly-2-vinylpyridine with excess iodine as a cathode material in a solid-state lithium-iodine primary battery employing lithium iodide as a solid electrolyte. While this prior art battery is characterized by a relatively high energy density, it suffers from several drawbacks. First of all, it is a primary battery, i.e., it is not capable of being recharged. Secondly, in order to avoid the problems which might be caused by undesired flow of the viscous charge transfer complex and undesired diffusion of the excess free iodine from the cathode mixture, it is necessary for the battery to be constructed with various internal protective coatings and containment materials, which increase the weight and size of the battery and reduce its energy density. Furthermore, the output current which the battery is able to deliver, both in relation to its electrode area and in relation to its weight, is rather low.

A recent article by Yoshimura, appearing in *Molecular Metals*, edited by William E. Hatfield, NATO Conference Series, Seris VI: Materials Science, pp. 471–489 (1978), at pages 474–476, refers to the above-described prior art solid-state lithium-iodine primary battery constructed with poly(vinylpyridine)iodine charge transfer complex cathode material, and broadly speculates that a number of the molecular metals, including doped polyacetylene, might possibly find similar utility as cathode materials in battery design. However, no further details are provided in regard to the possible construction or mode of operation of such hypothetical batteries. Furthermore, the possibility of doped acetylene polymers, or other doped conjugated polymers, being employed as one or both of the electrode materials in a secondary battery construction, i.e., in batteries which are capable of being charged and discharged over many cycles, is not even hinted at in this article.

SUMMARY OF THE INVENTION

It is, accordingly, a primary object of the present invention to provide a more efficient and economical procedure for the doping of acetylene polymers and other dopable conjugated polymers to p-type and n-type materials whose room temperature electrical conductivity may be preselected within a broad range of selectivity varying from that characteristic of semiconductor behavior to that characteristic of metallic behavior.

Another object of the invention is to provide a doping procedure, in accordance with the preceding object, which enables a more precise control of the degree and uniformity of doping than the prior art procedures so as to ensure production of a doped polymer product with a consistent and uniform room temperature electrical conductivity.

Still another object of the invention is to provide a doping procedure, in accordance with the preceding objects, which enables a greater degree of versatility than the prior art procedures in the selection of suitable doping materials.

A still further object of the invention is to provide a doping procedure, in accordance with the preceding objects, which enables the same doping material to be employed either selectively or simultaneously for carrying out p-type and/or n-type doping.

Yet another object of this invention is to provide a doping procedure, in accordance with the preceding objects, which is adaptable for use in the charging of secondary batteries in which a doped conjugated polymer is employed as one or both of the electrodes.

A yet further object of the invention is to provide novel secondary batteries which are characterized by a high energy density, a low overall weight and size, and a high output current in relation to both their electrode area and their weight.

The above and other objects are achieved in accordance with the present invention by means of an electrochemical doping procedure which enables acetylene polymers and other dopable conjugated polymers to be doped to a controlled degree with dopant ions to either a p-type or n-type material exhibiting a preselected room temperature electrical conductivity ranging from that characteristic of semiconductor behavior to that characteristic of metallic behavior. The procedure is carried out by providing an electrolytic cell wherein at least one of the electrodes includes the conjugated polymer to be doped as its electrode-active material, and the electrolyte comprises a compound which is ionizable into one or more species of dopant ions. The dopant ions comprise an anionic species when the polymer is used as the anode-active material, and a cationic species of a metal whose Pauling electronegativity value is no greater than 1.6 when the polymer is used as the cathode-active material. When an electrical potential sufficient to cause electrolysis of the electrolyte is applied to the electrolytic cell, the polymer becomes doped with the dopant ions to a degree proportional with the voltage and time period of the applied potential and the dopant ion concentration in the electrolyte, which are coordinated and controlled so that the corresponding degree of doping will be such as to provide the resulting doped polymer with the preselected room temperature electrical conductivity. The p-type or n-type nature of the resulting doped polymer will depend upon at which electrode of the electrolytic cell the polymer is employed. If the polymer is used as the anode-active material of the electrolytic cell, it becomes doped with the anionic dopant ions to a p-type material; whereas, if it is used as the cathode-active material of the electrolytic cell, it becomes doped with the cationic dopant ions to an n-type material.

In comparison with the prior art procedures for preparing doped conjugated polymers, the electrochemical doping procedure of the present invention enables a more reliably precise control of the degree and uniformity of doping so as to ensure production of a doped polymer product with a consistent and uniform room temperature electrical conductivity. Furthermore, since electrochemical doping is not dependent on the chemical reactivity of the doping material with the polymer, it enables greater versatility in the selection of suitable doping materials which are economically attractive. Moreover, it is possible with electrochemical doping to selectively or simultaneously effect p-type or n-type doping employing the same electrolyte as the doping material, depending upon whether the polymer is used as the anode-active material, the cathode-active material, or both, of the electrolytic cell.

With the above-described electrochemical doping procedure serving as the basis for their charging operation, novel secondary batteries are provided in accordance with the present invention which employ a doped conjugated polymer as the electrode-active material of one or both of their electrodes. In their charged state, such secondary batteries comprise an anode having as its anode-active material either a metal whose Pauling electronegativity value is no greater than 1.6, or a conjugated polymer doped with dopant cations of said metal to an electrically conducting n-type material; a cathode having as its cathode-active material a conjugated polymer doped with dopant anions to an electrically conducting p-type material; and an electrolyte comprising a compound which is ionizable into said dopant cations and said dopant anions. These secondary batteries may be assembled in their discharged state, with the conjugated polymer or polymers in undoped form and the electrolyte preferably impregnated within a solid matrix in the internal circuit of the battery. Doping of the polymer or polymers with the dopant ions of the electrolyte is thereafter carried out by means of the electrochemical doping procedure of the present invention whereby the battery is converted to its charged state. Recharging of the battery after discharge is similarly effected by such electrochemical doping procedure.

The novel secondary batteries in accordance with the present invention are characterized by a high energy density, a low overall weight and size, and a high output current both in relation to their electrode area and in relation to their weight.

DESCRIPTION OF PREFERRED EMBODIMENTS

The polymer which is used as the starting material in the electrochemical doping procedure of the present invention may be any conjugated polymer which is dopable to an electrically conducting state. A number of conjugated organic polymers which are suitable for this purpose are known in the art and include, for example, acetylene polymers, poly(p-phenylene), poly(m-phenylene), poly(phenylene sulfide), $-(C_6H_4CH=CH)_x$, polypyrrole, and the like. Such conjugated polymers may be employed in the present invention in any suitable form, such as, for example, in the form of films, foams, compressed films, or compressed powders. Acetylene polymers have been found to be particularly suitable starting materials.

The term "acetylene polymer", as used herein throughout the Specification and in the appended Claims, is intended to encompass polyacetylene, i.e., $(CH)_x$, as well as substituted polyacetylenes in which at least some of the hydrogen atoms on the polymer chain have been replaced by halogen, alkyl (e.g., up to about 20 carbon atoms), aryl (e.g., phenyl, halophenyl, or alkylphenyl), or combinations thereof. Such acetylene polymers may suitably be prepared for use in the present invention in the form of films, foams, compressed films, or compressed powders, by methods known in the art. For example, the synthesis of high quality, uniformly thin, flexible polycrystalline films of polyacetylene and their characterization are described in detail in a series of papers by Shirakawa, et al., [*Polymer Journal*, Vol. 2, No. 2, pp. 231-244, (1971); *Polymer Journal*, Vol. 4, No. 4, pp. 460-462, (1973); *Journal of Polymer Science*, Part A-1, Polymer Chemistry Edition, Vol. 12, pp. 11-20, (1974); and *Journal of Polymer Science*, Part A-1, Polymer Chemistry Edition, Vol. 13, pp. 1943-1950, (1975)], all of which are incorporated herein by reference. The synthesis procedures described by Shirakawa, et al., involve polymerizing acetylene monomer in the presence of a $Ti(OC_4H_9)_4-Al(C_2H_5)_3$ catalyst system, employing a critical catalyst concentration to avoid the formation of polyacetylene powder to obtain, depending on the polymerization temperature, polycrystalline polyacetylene films having an all cis structure (polymerization temperatures lower than $-78°$ C.), an all trans structure (polymerization temperatures higher than 150° C.), or a mixed cis-trans structure (polymerization temperatures between $-78°$ C. and 150° C.).

The Shirakawa, et al. polymerization procedure can similarly be employed for preparing films of the above-defined substituted polyacetylenes by using as the starting monomer a substituted acetylene monomer having the formula $RC\equiv CH$ or $RC\equiv CR'$ wherein R and R' are halogen, alkyl, or aryl. Such substituted acetylene monomers may be used either alone or in appropriate mixture with each other and/or with acetylene monomer in carrying out the polymerization reaction to obtain the desired substituted polyacetylene.

In an alternative procedure for preparing such substituted polyacetylenes, the starting material is a bromine-doped polyacetylene film prepared, for example, by the methods described in the aforementioned Heeger, et al. U.S. patent application Ser. No. 902,667. When this film is heated in vacuo to a temperature within the range of from 120°-150° C. in a sealed container, HBr and $Br_2$ are first evolved. This gaseous mixture is then permitted to react further with the film at room temperature and is then reheated to within the aforementioned temperature range. After this procedure has been repeated several times, all the $Br_2$ is absorbed and HBr is the only gaseous material formed. The resulting product is a substituted polyacetylene in which some of the hydrogen atoms on the polymer chain have been replaced by bromine atoms. Subsequent treatment of this substituted polyacetylene with alkyl or aryl organometallic reagents, e.g., methyl lithium, phenylmagnesium bromide, or Friedel-Craft-type reagents, will lead to replacement of the bromine atoms by the organic group in the organometallic reagent employed. In the substituted polyacetylenes prepared in this manner, some of the CH bonds in the original polyacetylene polymer may be converted to C—C or $C\equiv C$.

While the acetylene polymers employed in carrying out the present invention are preferably in the form of films, prepared as described above, they may also suitably be in the form of compressed powders prepared, for example, as described by Berets, et al. *Trans. Faraday Soc.*, Vol 64, pp. 823-828, (1968), incorporated herein by reference; or in the form of foams or compressed films prepared from intermediate gels, as described by Wnek, et al., *Polymer Preprints*, Vol. 20, No. 2, pp. 447-451, September, 1979, also incorporated herein by reference.

In accordance with the electrochemical doping procedure of the present invention, p-type doping of the conjugated polymer is effected with anionic dopant ions, while n-type doping of the polymer is effected with cationic dopant ions. A wide variety of dopant ion species may suitably be employed, either individually or in combination, for effectively modifying the room temperature electrical conductivity of the conjugated polymer in accordance with the present invention.

Suitable anionic dopant ions for effecting p-type doping include, for example, $I^-$, $Br^-$, $Cl^-$, $F^-$, $ClO_4^-$, $PF_6^-$, $AsF_6^-$, $AsF_4^-$, $SO_3CF_3^-$, $BF_4^-$, $BCl_4^-$, $NO_3^-$, $POF_4^-$, $CN^-$, $SiF_5^-$, $CH_3CO_2^-$(acetate), $C_6H_5CO_2^-$(benzoate), $CH_3C_6H_4SO_3^-$(tosylate), $SiF_6^{--}$, $SO_4^{--}$, or the like.

The cationic dopant ions suitable for effecting n-type doping are cations of a metal whose Pauling electronegativity value is no greater than 1.6. A complete list of such metals and their corresponding electronegativity values are provided in Table I below.

TABLE I

| Metal | Electronegativity Value |
|---|---|
| Cs | 0.7 |
| Rb | 0.8 |
| K | 0.8 |
| Na | 0.9 |
| Ba | 0.9 |
| Li | 1.0 |
| Sr | 1.0 |
| Ca | 1.0 |
| Mg | 1.2 |
| Y | 1.3 |
| Sc | 1.3 |
| Be | 1.5 |
| Al | 1.5 |
| Zr | 1.6 |
| Ti | 1.6 |

The above list of metals includes all of the alkali metals, all of the alkaline earth metals, and certain of the metals from Group 3 (Y, Sc and Al) and Group 4 (Zr and Ti) of the Periodic Table.

Each of the anionic and cationic dopant ion species set forth above will effect an increase, to varying degrees, in the room temperature electrical conductivity of the starting conjugated polymer. For the widest range in selectivity as to achievable conductivities, the preferred cationic dopant ions are alkali metal ions, particularly $Li^+$; and the preferred anionic dopant ions are halide ions, $ClO_4^-$, $PF_6^-$, $AsF_6^-$, $AsF_4^-$, $SO_3CF_3^-$, and $BF_4^-$.

A compound which is ionizable into one or more species of the above-described dopant ions is employed as the active material of the electrolyte of the electrolytic cell in carrying out the electrochemical doping procedure in accordance with the present invention, and thereby serves as the dopant ion source. Such ionizable compound may suitably be a simple salt of one of the cationic species of dopant ions with one of the anionic species of dopant ions, in which case the electrolyte has the versatility of being usable for selectively or simultaneously effecting p-type or n-type doping, depending upon whether the conjugated polymer is used as the anode-active material, the cathode-active material, or both, of the electrolytic cell. Alkali metal halides and perchlorates are particularly useful examples of this type of ionizable compound. Other types of ionizable compounds, which are ionizable into only one species of dopant ions, are also suitable for use in carrying out the electrochemical doping procedure in accordance with the present invention, in those instances wherein only one type of doping, i.e., either p-type or n-type, is desired. For example, for use in carrying out p-type doping with an anionic species of dopant ions, the ionizable compound of the anionic dopant ion species may suitably be a tetraalkyl ammonium salt, a tetraalkyl phosphonium salt, a tetraalkyl arsonium salt, or a trialkyl oxonium salt, wherein the alkyl groups typically contain from one to ten carbon atoms.

The ionizable compound, which is used as the active electrolyte material of the electrolytic cell in carrying out the electrochemical doping procedure in accordance with the present invention, may suitably be employed in the form of a solid, fused solid (i.e., molten salt, e.g., $Na_{0.5}K_{0.5}[AlCl_4]$), pure liquid, or dissolved in a suitable solvent for the ionizable compound which is inert with respect to the electrode material and which will permit the migration of the dopant ions to the electrode-active materials. Alkali metal halides such as LiI are particularly suitable for use as solid electrolytes. Suitable solvents for use in preparing electrolyte solutions include water, methylene chloride, acetonitrile, alcohols (e.g., ethyl alcohol), ethers (e.g., monoglyme or diglyme), cyclic ethers (e.g., tetrahydrofuran or dioxane), hexamethylphosphoramide, propylene carbonate, methyl acetate, or the like. When using an electrolyte solution for carrying out n-type doping with $Li^+$, $Na^+$, or $K^+$, it is generally preferred to employ ethers or cyclic ethers as the solvent due to the high reactivity of the resulting doped material with many of the other solvents. The concentration of the ionizable compound when employed in the form of an electrolyte solution may suitably be within the range of from about 0.1 to about 2.0 molar. The solutions of lower molarity are preferably employed when the doped polymer being prepared is to have a relatively low room temperature electrical conductivity, while the solutions of higher molarity are preferably employed when such doped polymer is to have a relatively high conductivity.

In assembling the electrolytic cell for carrying out the electrochemical doping procedure in accordance with the present invention, the conjugated polymer to be doped is employed as the electrode-active material of one or both of the electrodes, depending upon the type of doping desired. If only p-type doping is to be effected, the polymer will be used as the anode-active material, and a suitable electrolyte will be chosen so as to comprise a compound which is ionizable at least into an anionic species of dopant ions. If only n-type doping is to be effected, the polymer will be used as the cathode-active material, and a suitable electrolyte will be chosen so as to comprise a compound which is ionizable at least into a cationic species of dopant ions. In each of these two cases, the other electrode may suitably comprise any metal which is inert to the electrolyte employed, such as, for example, platinum, palladium, ruthenium, rhodium, gold, iridium, or the like. If it is desired to effect both p-type and n-type doping simultaneously in the same electrolytic cell, a conjugated polymer can be employed both as the anode-active material and as the cathode-active material of the cell, and a suitable electrolyte chosen so as to comprise a compound which is ionizable into both an anionic species and a cationic species of dopant ions.

The electrical energy source for powering the electrolytic cell in carrying out the electrochemical doping procedure in accordance with the present invention, may suitably be any DC powder supply, such as, for example, a battery, which is capable of delivering an electrical potential sufficiently high to initiate electrochemical oxidation and/or reduction of the conjugated polymer, or electron transfer from and/or to the polymer, but sufficiently low so as not to produce electrochemical degradation of the polymer. Such electrical potential may suitably be, for example, within the range of from about 2 to 25 volts, with about 9 volts being found to be particularly suitable.

For producing a doped conjugated polymer exhibiting a preselected p-type or n-type room temperature electrical conductivity by means of the electrochemical doping procedure of the present invention, an electrolytic cell is first assembled in the appropriate manner for obtaining the desired type of doping as described above, i.e., with the polymer or polymers at the appropriate electrode position and with the appropriate electrolyte and DC power supply. An electrical potential sufficient to cause electrolysis of the electrolyte is then applied to the electrolytic cell, whereby doping of the polymer with the dopant ions occurs by migration of the anionic dopant ions into the anode-active polymer to produce a p-type material and/or by migration of the cationic dopant ions into the cathode-active polymer to produce an n-type material. The degree of such doping will be proportional with the voltage and time period of the applied potential and the dopant ion concentration in the electrolyte, all of which variables are properly coordinated and controlled so that the corresponding degree of doping will be such as to provide the resulting doped polymer or polymers with the preselected room temperature electrical conductivity. In general, the required degree of doping can suitably be obtained with applied potentials ranging from about 2 to 25 volts for a time period ranging from about a few minutes to about a few hours and with dopant ion concentrations equivalent to an electrolyte solution having an ionizable compound concentration within the range of from about 0.01 to about 2.0 molar. Within these broad operating ranges, the proper combination of the voltage and time period of the applied potential and the dopant ion concentration in the electrolyte to obtain the desired degree of doping can generally be predetermined by trial and error procedures. For example, employing as the electrolyte a 0.5 molar solution of either potassium iodide or tetra-n-butyl ammonium perchlorate, and an applied potential of about 9 volts, polyacetylene can be electrochemically doped with $I_3^-$ or $ClO_4^-$, respectively, to a highly conductive metallic state in a time period ranging from about 0.5 to about 1.0 hour.

Simplification of the coordination and control of these operating condition variables of the electrochemical doping procedure so as to enable precise achievement of the desired degree of doping, is made possible by the fact that the progressive conversion of the conjugated polymer to a more highly conductive state with increasing degree of doping is accompanied by a correspondingly progressive increase in the current flow through the electrolytic cell. Thus, once the correlation between such current flow and the degree of doping has been established for any given electrochemical doping system, monitoring of such current flow, for example, by means of an ammeter connected into the external circuitry of the electrolytic cell, provides a direct monitoring of the degree of doping in that system. Furthermore, provided that the electrolyte employed is one which is normally chemically unreactive with the polymer so that the doping reaction is entirely electrochemical in nature, such reaction is terminable with a sharp cutoff point precluding any over-doping of any portion of the polymer, merely by switching off the electrical potential being applied to the electrolytic cell. These two features combine to provide the electrochemical doping procedure of the present invention with a reliably precise control of the degree and uniformity of doping so as to ensure production of a doped polymer product with a consistent and uniform room temperature electrical conductivity.

The maximum degree of doping and the corresponding maximum level of room temperature electrical conductivity of the resulting doped polymer, which are achievable by means of the electrochemical doping procedure of the present invention, will vary with the particular type and form of conjugated polymer and the particular species of dopant ions employed. Up to such maximum level, the resulting conductivity will increase with increasing degrees of doping. With acetylene polymers, for example, a degree of doping ranging from less than about 0.001 to about 0.1 mol of dopant ion per carbon atom of the acetylene polymer main chain will increase the room temperature electrical conductivity of the starting acetylene polymer to a value ranging from slightly in excess of that of the undoped acetylene polymer up to on the order of $10^3$ ohm$^{-1}$ cm$^{-1}$. Since the conductivity of the undoped acetylene polymer will typically be on the order of about $10^{-9}$ to $10^{-5}$ ohm$^{-1}$ cm$^{-1}$ depending upon its composition and method of preparation, and since the semiconductor-metal transition of the doped polymer will generally be reached at a conductivity of approximately 1 ohm$^{-1}$ cm$^{-1}$, the electrochemical doping procedure of the present invention provides a broad range of selectivity in the resulting room temperature electrical conductivity of the doped polymer, extending over the entire semiconductor regime and into the metallic regime.

The electrochemical doping procedure of the present invention may suitably be employed as an efficient and economical means for the production of p-type or n-type doped polymer stock material of varying levels of room temperature electrical conductivity for use in a wide variety of electrical and electronic device applications. Another particularly useful application of such electrochemical doping procedure is in the design of novel secondary batteries in accordance with the present invention which employ a doped conjugated polymer as the electrode-active material of one or both of their electrodes and which rely upon electrochemical doping of such polymer or polymers as the mechanism for their charging operation. Such secondary batteries may suitably be fabricated in their charged state employing pre-doped polymer, or, alternatively, they may be assembled in their discharged state employing undoped polymer and thereafter converted to their charged state by electrochemical doping of the polymer or polymers. In either case, recharging of the battery after discharge is effected by such electrochemical doping procedure.

In the charged state of the novel batteries in accordance with the present invention, one or both of the electrodes includes as its electrode-active material a conjugated polymer doped to an electrically conducting state with dopant ions. The type of dopant ions will depend upon whether the doped polymer is employed as the anode-active material or the cathode-active material. When employed as the anode-active material of the battery, the conjugated polymer is doped to an electrically conducting n-type material with dopant cations of a metal whose Pauling electronegativity value is no greater than 1.6. When employed as the cathode-active material of the battery, the conjugated polymer is doped with dopant anions to an electrically conducting p-type material. The conjugated polymers, dopant cations and dopant anions suitable for use in battery construction in accordance with the present invention are the same as those described above in connection with the electrochemical doping procedure. Preferably, the degree of doping of the electrode-active doped conjugated polymers, at least when the battery is in its fully charged state, should be sufficient to provide the polymers with room temperature electrical conductivities in the metallic regime, i.e., at least about 1 ohm$^{-1}$ cm$^{-1}$. The exact degree of doping sufficient to meet this requirement will vary with the particular type and form of conjugated polymer and the particular species of dopant ions employed. With acetylene polymers, for example, such degree of doping typically will be in the range of from about 0.01 to about 0.1 mol of dopant ion per carbon atom of the acetylene polymer main chain.

Particularly suitable for use as anode-active materials are acetylene polymers doped to an electrically conducting n-type material with dopant cations of an alkali metal, particularly lithium. Particularly suitable for use as cathode-active materials are acetylene polymers doped to an electrically conducting p-type material with halide or perchlorate dopant anions, particularly iodide ions.

The above-described cation-doped conjugated polymers may be used as the anode-active material in a wide variety of battery systems in combination with compatible cathode-active materials and compatible electrolytes. Similarly, the above-described anion-doped conjugated polymers may be used as the cathode-active material in a wide variety of battery systems in combination with compatible anode-active materials and compatible electrolytes. One type of battery system found to be particularly suitable in accordance with the present invention is a system in which such cation-doped conjugated polymer anode-active material and such anion-doped conjugated polymer cathode-active material are employed in combination with each other together with an electrolyte comprising a compound which is ionizable into the dopant cations and the dopant anions. Another type of battery system found to be particularly suitable is a system in which such anion-doped conjugated polymer cathode-active material is employed in combination with an anode which includes as its anode-active material a metal whose Pauling electronegativity value is no greater than 1.6, particularly an alkali metal, more particularly lithium, together with an electrolyte comprising a compound which is ionizable into cations of said metal and the dopant anions.

For purposes of convenience, the novel batteries of the present invention will be further described in terms of the two specific types of systems referred to above. It will be understood, however, that such description, with appropriate modification as will be readily apparent to those skilled in the art, is similarly applicable to other types of battery systems within the scope of the present invention.

The ionizable compound of the electrolyte will, as a general rule, be a salt of the same species as the dopant ions, or of the metal and dopant anions, as the case may be, of the electrode-active materials. Particularly suitable systems are those which employ as the electrolyte salt an alkali metal halide or perchlorate, for example, lithium iodide. Such systems will thus typically employ as the anode-active material either an alkali metal or an alkali metal-doped conjugated polymer, and as the cathode-active material a halide- or perchlorate-doped conjugated polymer. The electrolyte salt may be used in the form of a solid electrolyte, but is preferably employed in the form of an electrolyte solution or suspension in a suitable solvent which is inert with respect to the electrode materials and which will permit the migration of the electrolyte ions to and from the electrode-active materials (for example, an ether, such as monoglyme or diglyme, or a cyclic ether, such as tetrahydrofuran or dioxane). Since the electrolyte preferably includes only a minimal amount of solvent to facilitate ionic mobility, a particularly suitable form of the electrolyte is a suspension of the electrolyte salt in its saturated solution, e.g., a paste.

The electrolyte is preferably impregnated within a solid matrix in the internal circuit of the battery structure. Such solid matrix may comprise one or both of the electrode-active doped conjugated polymers and/or an inert porous medium permeable to the electrolyte and separating the two electrode-active materials, such as, for example, filter paper, glass frit, porous ceramic, the conjugated polymer in undoped form, or the like. When impregnated within the electrode-active doped conjugated polymer, the electrolyte further serves as an ionic conductor which fills the voids in whole or in part between particles or fibers of the polymeric material. The impregnation may be effected by wetting the matrix material with a concentrated, e.g., saturated, solution or suspension of the electrolyte salt in a suitable inert solvent, as described above. While the solvent may subsequently be volatilized, for example, under vacuum, to leave the electrolyte salt impregnated within the matrix as a solid electrolyte, it has been found preferable to maintain a minimal amount of solvent present in the impregnated matrix in order to facilitate ionic mobility.

While either or both of the electrodes may consist entirely of their respective electrode-active materials as described above, it is generally preferred that each electrode also include a suitable current collector for supporting the electrode-active material and providing electrical connection thereto, according to techniques well-understood in the art. Such current collector may suitably be formed of any electrically conductive material which is chemically stable toward the electrode-active material, such as, for example, platinum, tantalum, carbon, aluminum, stainless steel, or the like.

When the batteries are assembled in their discharged state, the electrode-active conjugated polymer or polymers are employed in undoped form, i.e., the anode-active material is either a metal whose Pauling electronegativity value is no greater than 1.6 or an undoped conjugated polymer, and the cathode-active material is an undoped conjugated polymer. When both electrode-active materials are a conjugated polymer, the anode-active material and the cathode-active material may be two separate masses of conjugated polymer, or alternatively, may be opposite surfaces of the same unitary mass of conjugated polymer. The source of the dopant ions for converting the conjugated polymer or polymers to their doped form is the electrolyte salt, which may be suitably incorporated into the internal circuit of the battery structure in excess of the amount required for the doping operation—for example, by wetting the polymer or polymers with a highly concentrated, preferably saturated, solution thereof in a suitable inert solvent to impregnate the electrolyte within the polymer matrix. Alternatively, the electrolyte may be similarly impregnated within another inert porous medium permeable to the electrolyte, such as, for example, filter paper, glass frit, porous ceramic, or the like, and the thus-impregnated porous medium matrix may then be inserted between the anode-active material and the cathode-active material.

The secondary battery thus-assembled in its discharged state is then converted to its charged state by means of the previously described electrochemical doping procedure in accordance with the present invention. Specifically, the secondary battery is externally connected to a suitable DC power supply, such as, for example, a 9-volt battery, so as to form an electrolytic cell. In accordance with conventionally accepted nomenclature, the anode-active material of the secondary battery becomes the cathode-active material of the electrolytic cell, and correspondingly, the cathode-active material of the secondary battery becomes the anode-active material of the electrolytic cell. When an electrical potential is applied to the electrolytic cell, electrolysis of the electrolyte occurs, whereby the cations and the anions thereof migrate, respectively, to the cathode and anode of the electrolytic cell. This results in the anode-active conjugated polymer of the electrolytic cell (i.e., the cathode-active conjugated polymer of the secondary battery) becoming doped with dopant anions to an electrically conducting p-type material. When the secondary battery structure is such that each electrode includes a conjugated polymer as its electrode-active material, the cathode-active conjugated polymer of the electrolytic cell (i.e., the anode-active conjugated polymer of the secondary battery) simultaneously becomes doped with dopant cations to an electrically conducting n-type material. As more fully discussed above in the general description of the electrochemical doping procedure of the present invention, such doping of the electrode-active conjugated polymer or polymers will occur to a degree proportional with the voltage and time period of the applied potential and the dopant ion concentration in the electrolyte, all of which variables are properly coordinated and controlled so that the corresponding degree of doping will be such as to provide the resulting doped conjugated polymer or polymers with room temperature electrical conductivities sufficient to convert the secondary battery to a charged state. For full charging of the secondary battery, such degree of doping will generally be such as to provide the doped conjugated polymer or polymers with room temperature electrical conductivities in the metallic regime, i.e., at least about 1 ohm$^{-1}$ cm$^{-1}$.

Upon completion of the charging operation, the resulting charged secondary battery is disconnected from the DC power supply and is then ready for use. Such charged secondary battery will comprise the metal or cation-doped conjugated polymer, as the case may be, as its anode-active material, the anion-doped conjugated polymer as its cathode-active material, and the electrolyte remaining unspent from the doping operation as its electrolyte. In the embodiment described above wherein the secondary battery in its discharged state has an anode-active conjugated polymer and a cathode-active conjugated polymer formed as opposite surfaces of the same unitary mass of conjugated polymer having the electrolyte impregnated therewithin, the resulting charged secondary battery will have its anode-active cation-doped conjugated polymer and its cathode-active anion-doped conjugated polymer formed respectively as the two opposite surface layers of a three-layered unitary mass of conjugated polymer whose central layer is the conjugated polymer in undoped form and impregnated with the unspent electrolyte.

As indicated above, the novel secondary batteries in accordance with the present invention may also be suitably assembled in their already-charged state by employing a conjugated polymer or polymers which have been pre-doped to the required degree with the appropriate species of dopant ions. Such pre-doped polymers may be prepared either by the electrochemical doping procedure of the present invention or by the prior art doping techniques described in the aforementioned Heeger, et al., U.S. patent applications Ser. Nos. 902,666 and 902,667. Incorporation of the electrolyte into the internal circuit of the battery structure may suitably be effected in a manner similar to that described above in connection with the assembly of the battery in its discharged state, i.e., by impregnating the electrolyte within the doped conjugated polymer or polymers, or within an undoped conjugated polymer or other inert porous medium permeable to the electrolyte and which separates the anode-active material and the cathode-active material.

The operational discharge of the batteries of the present invention involves the internal liberation of dopant cations or cations of the metal from the anode-active material and dopant anions from the cathode-active material, resulting in the in situ formation of additional amounts of the electrolyte salt as the cell discharge reaction product. While it is possible to rely solely upon such in situ-formed electrolyte salt as the electrolyte of the battery, it has been found that the performance characteristics of the battery (e.g., the energy density) are enhanced when the battery in its charged state is initially primed with electrolyte in excess of that formed in situ, for example, by the impregnation techniques described above.

During operational discharge of the secondary batteries of the present invention, the electrode-active doped conjugated polymer or polymers undergo depletion in their dopant ion content and a corresponding decrease in their room temperature electrical conductivities. When the battery has reached a discharged state, repetition of the electrochemical doping technique described above replenishes such dopant ion content to its initial level and restores the battery to a fully-charged state. The secondary batteries of the present invention are in this manner capable of being discharged and recharged over many cycles.

The extremely light weight and high conductivity of doped conjugated polymers, particularly when employed in the form of films ranging in thickness, for example, of from 10 to 100 microns, enable the construction of novel secondary batteries in accordance with the present invention which are characterized by a high energy density, a low overall weight and size, and a high output current both in relation to their electrode area and in relation to their weight.

It will be understood that while the batteries of the present invention have been described principally in terms of their use as secondary batteries, i.e., having the ability of operating both in the discharge mode and in the charge mode so as to permit multiple reuse, they may, if desired, also be employed as primary batteries operating in the discharge mode alone.

The invention is further illustrated by way of the following examples.

EXAMPLE 1

A 1 cm $\times$ 3 cm $\times$ 0.01 cm strip of polyacetylene film composed of approximately 82% cis-isomer and having a room temperature electrical conductivity of about $1 \times 10^{-8}$ ohm$^{-1}$ cm$^{-1}$, was employed as the anode of an electrolytic cell having a platinum cathode and an aqueous 0.5 M potassium iodide electrolyte solution. The electrolytic cell was powered by a 9-volt battery, and an ammeter was connected into the external circuit of the cell. Electrolysis of the electrolyte was carried out by applying to the cell an electrical potential of 9 volts for a period of 0.5 hour, during which time the current as measured by the ammeter increased from 1 to 43 mA. The anode film was then removed from the cell, and its composition was determined by elemental analysis to be $(CHI_{0.07})_x$. It is important to note that the iodide-doped polyacetylene film contained no oxygen (total C, H, and I content equalled 99.8%) and hence had undergone no hydrolysis and/or oxidation during the electrolytic doping process.

The room temperature electrical conductivity of the p-type iodide-doped polyacetylene film was measured using four-probe DC techniques, and was found to be 9.7 ohm$^{-1}$ cm$^{-1}$. This value is consistent with that previously observed for polyacetylene films doped with iodine to the same extent by exposure of the polyacetylene films to iodine vapor.

EXAMPLE 2

The procedure of Example 1 was repeated, but this time employing as the electrolyte a 0.5 M solution of tetra-n-butyl ammonium perchlorate in methylene chloride. The 9-volt potential was applied for a period of 1 hour, during which time the current as measured by the ammeter increased from 0.95 to 3.4 mA. The resulting p-type doped polyacetylene film was found to have the composition $[CH(ClO_4)_{0.0645}]_x$, and a round temperature electrical conductivity of 970 ohm$^{-1}$ cm$^{-1}$.

When the procedures of examples 1 and 2 were carried out for shorter electrolysis times, the resulting doped polyacetylene films were found to have lower doping levels and correspondingly lower room temperature conductivities in the semiconductor regime.

EXAMPLE 3

The procedure of Example 1 was repeated, but this time employing as the electrolyte a 0.3 M solution of $[Pr^n_3NH]^+[AsF_6]^-$ in methylene chloride. The 9-volt potential was applied for a period of 0.75 hour, during which time the current as measured by the ammeter increased from 0.4 to 1.02 mA. The resulting p-type doped polyacetylene film was found by elemental analysis to have a composition corresponding to $[CH(AsF_4)_{0.077}]_x$, and a room temperature electrical conductivity of 553 ohm$^{-1}$ cm$^{-1}$. It is believed that the $AsF_4^-$ ion is formed by a reaction sequence involving proton abstraction from $[Pr^n{}_3NH]^+$ by fluorine atoms from $AsF_6^-$ during the electrolysis process.

EXAMPLE 4

The procedure of Example 1 was repeated, but this time employing as the electrolyte a 0.3 M solution of $[Bu^n{}_4N]^+[SO_3CF_3]^-$ in methylene chloride. The 9-volt potential was applied for a period of 0.5 hour, during which time the current as measured by the ammeter increased from 1.6 to 2.35 mA. The resulting p-type doped polyacetylene film was found to have the composition $[CH(SO_3CF_3)_{0.06}]_x$, and a room temperature electrical conductivity of 255 ohm$^{-1}$ cm$^{-1}$.

EXAMPLE 5

The procedure of Example 1 was repeated, but this time employing the polyacetylene film as the cathode, and the platinum electrode as the anode of the electrolytic cell, and employing as the electrolyte an essentially saturated solution of lithium iodide in tetrahydrofuran. The 9-volt potential was applied for a period of 0.5 hour, during which time the current as measured by the ammeter increased from 16 to 40 $\mu$A. This procedure resulted in the polyacetylene film becoming doped with lithium ions to an n-type material.

EXAMPLE 6

This example illustrates one embodiment of the novel secondary battery construction in accordance with the present invention, assembled in its charged state.

A disc (7.8 mm in diameter and 50 microns in thickness) of p-type iodide-doped polyacetylene film having the composition $(CHI_{0.08})_x$, was saturated with a saturated solution of lithium iodide in a 50/50 (vol/vol) isopropanol/water solvent. The solvent was then removed under vacuum, thereby leaving the lithium iodide impregnated within the doped polyacetylene film as a solid electrolyte.

The thus-prepared lithium iodide-impregnated doped polyacetylene film disc was then used as the cathode-active material together with lithium as the anode-active material in the assembly of a battery, the assembly steps being carried out in a glove box under a dry atmosphere to avoid the adverse effects of atmospheric moisture on the cell components. The lithium iodide-impregnated doped polyacetylene film disc in surface contact with a lithium metal disc (7.8 mm in diameter and 1 mm in thickness) was sandwiched between two platinum foil disc current collectors (4 mm in diameter and 50 microns in thickness) within a cell body constructed from Plexiglas material, and intimately pressed together using a mechanical press. Platinum wire metal leads (5 mil thickness) spot-welded to the platinum current collectors and extending through the cell body, were provided for external circuit connections.

The resulting battery structure was then tested for its voltage and current outputs under continuous discharge for a period of 20 days through a load resistor of 1,050 ohms, the voltage and current being measured using a Keithley Digital Multimeter. A peak voltage of 2.1 volts and a peak current of 40 $\mu$A was reached within 1 hour. This current level corresponds to an output current per unit area of electrode of 300 $\mu$A/cm$^2$, and to an output current per unit of weight of the battery of 4,000 $\mu$A/g. The energy density of the battery device was found to be 0.06 Wh/g. Since it appears likely that the weight of this battery could be reduced approximately 10-fold, e.g., by reducing the thickness of the lithium metal disc to 100 microns, without any adverse effect on the battery performance, the energy density and output current per unit of weight values achievable with this battery structure should be easily improvable to approximately 0.6 Wh/g and 40,000 $\mu$A/g, respectively.

After 20 days of continuous discharge, the battery device appeared to be heavily drained, producing a voltage of only 0.6 volts and a current of only 0.1 $\mu$A. At this point, the battery device was recharged, using an electrical potential of 9 volts from a DC power supply, for a period of 6 hours. After recharging, the output voltage and current were found to be 2.8 volts and 19 $\mu$A, respectively.

EXAMPLE 7

This example illustrates a modification of the battery embodiment described in Example 6, wherein a semi-hermetically sealed button cell was used to encapsulate the battery components, and which relies solely upon the in situ-formed lithium iodide cell discharge reaction product as its electrolyte.

The entire assembly of the battery components was carried out under an argon atmosphere in a glove box. The button cell comprised a flat-bottom, substantially cup-shaped, aluminum capsule and a teflon cover. A lithium metal disc (4 mm in diameter and 1 mm in thickness) was placed in the open aluminum capsule. Another disc (4 mm in diameter and 50 microns in thickness) of p-type iodide-doped polyacetylene film having the composition $(CHI_{0.2})_x$, was placed directly atop the lithium metal disc. The teflon cover, with a spiral of platinum wire in the center of it, serving as the electrical contact, was then placed over these components. The cell was mechanically sealed to give a semi-hermetic seal. The teflon cover was further sealed with a thin coating of a sealant grease. The cell was then removed from the glove box, and a platinum wire was then attached to the bottom of the aluminum capsule using Electrodag cement. The resulting battery structure was then mounted in 4-probe apparatus, and the apparatus was evacuated.

The battery was tested for its voltage and current outputs under continuous discharge for a period of eight days through a load resistor of 126,000 ohms. A voltage of about 2.0 volts was obtained immediately after assembly. A maximum voltage of about 2.6 volts was observed after sixteen hours, and upon discharge for five days, dropped to about 1.3 volts. From a current versus time plot, the approximate area under the curve represented $1 \times 10^{-4}$ Wh of energy. Assuming a weight of 5 mg for the lithium and iodide-doped polyacetylene discs, this represents an energy density of 0.02 Wh/g. Since the effective electrode area in this cell was about 0.13 cm$^2$, the output current per unit area of electrode, through a load resistor of 126,000 ohms, was about 32 $\mu$A/cm$^2$.

EXAMPLE 8

This example illustrates another embodiment of the novel secondary battery construction in accordance with the present invention, assembled in its discharged state.

The entire assembly of the cell was carried out under an argon atmosphere in a glove box. The materials used for encapsulating the cell components comprised a phenolic threaded sleeve (½ inch in length), and two stainless steel bolts with the ends polished. One of the stainless steel bolts was screwed into the threaded sleeve, and a disc (6 mm in diameter) of undoped polyacetylene film was placed into the sleeve on top of the stainless steel bolt. A drop of a saturated solution of lithium iodide in tetrahydrofuran was dropped onto the polyacetylene disc. A filter paper disc (6 mm in diameter) was placed atop the polyacetylene disc, and another drop of the lithium iodide solution was dropped onto the filter paper disc. Another disc (6 mm in diameter) of undoped polyacetylene film was then placed atop the filter paper disc, and several more drops of the lithium iodide solution were added. The other stainless steel bolt was then screwed into the threaded sleeve and finger-tightened. The cell assembled in the above manner was then placed in a 4 oz. glass jar having some tetrahydrofuran in it to prevent the cell from drying out.

The cell was then connected with a 9-volt transistor battery, and charged for six minutes. Immediately after such charging operation, the cell was found to have a short-circuit current of 1.6 mA and a short-circuit voltage of 2.8 volts. Using these short-circuit values for the cell, the cell was found to have a current per unit area of electrode of 5.7 mA/cm$^2$, and a power per unit area of electrode of 16 mW/cm$^2$.

When the above cell was then recharged for one hour and then connected to a 126,000 ohm load resistor, an output current of 20 µA and a voltage of 2.7 volts were obtained. This cell was repeatedly charged and discharged, with similar currents and voltages being obtained. From a current versus time plot, the area under the curve represented $7.5 \times 10^{-4}$ Wh of energy. Assuming a weight of 15 mg for the polyacetylene-filter paper-polyacetylene assembly, this represents an energy density of 0.05 Wh/g. Since the effective electrode area in this cell is about 0.3 cm$^2$, the output current per unit area of electrode is about 60 µA/cm$^2$ through a 126,000 ohm load resistor.

EXAMPLE 9

This example illustrates a modification of the battery embodiment described in Example 8, wherein the lithium iodide was employed in the form of a solid electrolyte.

The cell was constructed in its discharged state as described in Example 8, above. The cell was charged with a 9-volt battery for a period of four minutes, and connected to 126,000 ohm load resistor. A current of 18 µA and a voltage of 2.4 volts were observed. The battery was then almost completely discharged, and thereafter recharged using a 9-volt battery for a period of about 50 minutes. The current and voltage observed was 14 µA and 2.3 volts, respectively, after the charging.

The charged cell was then evacuated for about eight minutes in order to remove the tetrahydrofuran solvent therefrom and leave the lithium iodide remaining therein in the form of a solid electrolyte. The current and voltage values observed for the resulting solid-state cell were 0.2 µA and 0.9 volts, respectively. When this solid-state cell was again charged with a 9-volt battery for about 1.3 hours, a voltage of 1.02 volts and a current of 0.3 µA was observed.

EXAMPLE 10

This example illustrates still another embodiment of the novel secondary battery construction in accordance with the present invention, also assembled in its discharged state.

A disc (8 mm in diameter and 50 microns in thickness) of undoped polyacetylene film was saturated with a saturated solution of lithium iodide in a 50/50 (vol/vol) isopropanol/water solvent. The solvent was then removed under vacuum, thereby leaving the lithium iodide impregnated within the polyacetylene film as a solid electrolyte.

The thus-prepared lithium iodide-impregnated polyacetylene film disc was then assembled into a battery, in a glove box under a dry atmosphere, by sandwiching it between two platinum foil disc current collectors (5 mm in diameter and 50 microns in thickness) within a cell body constructed from Plexiglas material. Platinum wire leads (5 mil thickness) spot-welded to the platinum current collectors and extending through the cell body, were provided for external circuit connections.

Preliminary testing was carried out on the resulting secondary battery assembled in its discharged state, merely to confirm its capability of being converted to a charged state through a solid-state electrochemical doping of the opposite surface layers of the polyacetylene film disc with, respectively, Li$^+$ and I$^-$ furnished by the lithium iodide solid electrolyte impregnated within the film. Thus, the secondary battery in its discharged state was connected to a 9-volt battery and charged therewith for a period of four hours. Immediately after such charging operation, the voltage and current outputs of the secondary battery, under discharge through a load resistor of 1,050 ohms, were found to be 0.62 volts and 7.4 µA, respectively, thereby indicating that the secondary battery had been converted to a charged state.

EXAMPLE 11

This example illustrates a modification of the battery construction described in Example 10, employing the lithium iodide in the form of an electrolyte solution, and also employing different materials for encapsulating the battery components.

The entire assembly of the battery components was carried out under an argon atmosphere in a glove box. The materials for encapsulating the battery components comprised a nylon nut (⅜ inch outside diameter and ¼ inch in length) and two stainless steel bolts with their ends polished. One of the stainless steel bolts was screwed into the nylon nut, and a disc (6 mm in diameter) of undoped polyacetylene film was placed within the nut on top of the stainless steel bolt. On to the polyacetylene film disc was dropped one drop of a saturated solution of lithium iodide in tetrahydrofuran. The other bolt was then screwed into the nylon nut, and the resulting assembly placed in a 4 oz. glass containing some tetrahydrofuran.

The resulting secondary battery assembled in its discharged state was then charged with a 9-volt battery for about three seconds, and was then connected to a 126,000 ohm load resistor. The resulting charged battery was found to have an output current of 7 µA and a voltage of 0.9 volts.

The embodiments of the invention in which an exclusive property or privilege is claimed are defined as follows:

1. A reversible electrochemical method for modifying the electrical conductivity properties of an organic polymer which is dopable with an anionic dopant species to a more highly electrically conducting state, comprising the steps of:
   (a) providing an electrochemical cell comprising an anode means, a cathode means, and an electrolyte, said anode means including said polymer as an anode-active material, said electrolyte comprising a compound which is ionizable into said anionic dopant species; and
   (b) operating said electrochemical cell so as to effect an increase in the oxidation state of said polymer, whereby said polymer becomes doped with said anionic dopant species to a more highly electrically conducting state;
said organic polymer being a conjugated polymer characterized by having conjugated unsaturation along a main backbone chain thereof, whereby the range of selectivity of room temperature electrical conductivity of the resulting doped polymer extends into the metallic regime.

2. The method of claim 1, wherein said increase in the oxidation state of said polymer is effected by electron transfer from said polymer.

3. The method of claim 1, wherein the degree of increase effected in said oxidation state of said polymer and the dopant species concentration in said electrolyte are such that the resulting degree of doping provides the resulting doped polymer with a preselected room temperature electrical conductivity ranging from that characteristic of semiconductor behavior to that characteristic of metallic behavior.

4. The method of claim 3, wherein said preselected room temperature electrical conductivity is in the metallic regime.

5. The method of claim 1, wherein said conjugated polymer is an acetylene polymer.

6. The method of claim 5, wherein said acetylene polymer is polyacetylene.

7. The method of claim 1, wherein said conjugated polymer is in the form of a film.

8. The method of claim 85 wherein said anionic dopant species is selected from the group consisting of halide ions, $ClO_4^-$, $PF_6^-$, $AsF_6^-$, $AsF_4^-$, $SO_3CF_3^-$, $BF_4^-$, and mixtures thereof.

9. The method of claim 1, wherein said electrochemical cell is an electrolytic cell.

10. The method of claim 9, wherein the operation of said electrolytic cell is carried out at an applied voltage and for a period of time which, in combination, are sufficient to convert said electrolytic cell into a charged secondary battery.

11. The method of claim 10, wherein said dopable conjugated polymer initially is in a substantially undoped state and becomes doped to its final doped state solely via operation of said electrolytic cell.

12. The method of claim 10, wherein said electrolyte is employed in an amount in excess of that required for effecting the doping operation, whereby the unspent portion thereof constitutes the electrolyte of the resulting charged secondary battery.

13. A reversible electrochemical method for modifying the electrical conductivity properties of a conjugated polymer which is characterized by having conjugated unsaturation along a main backbone chain thereof and which is dopable with a cationic dopant species to a more highly electrically conducting state, so as to provide said polymer with a room temperature electrical conductivity ranging from that characteristic of semiconductor behavior to that characteristic of metallic behavior, comprising the steps of:
   (a) providing an electrochemical cell comprising an anode means, a cathode means, and an electrolyte, said cathode means including said conjugated polymer as a cathode-active material, said electrolyte comprising a compound which is ionizable into said cationic dopant species; and
   (b) operating said electrochemical cell so as to effect a decrease in the oxidation state of said polymer, whereby said polymer becomes doped with said cationic dopant species to a more highly electrically conducting state.

14. The method of claim 13, wherein said decrease in the oxidation state of said polymer is effected by electron transfer to said polymer.

15. The method of claim 13, wherein the degree of decrease effected in said oxidation state of said polymer and the dopant species concentration in said electrolyte are such that the resulting degree of doping provides the resulting doped polymer with a preselected room temperature electrical conductivity.

16. The method of claim 15, wherein said preselected room temperature electrical conductivity is in the metallic regime.

17. The method of claim 13, wherein said conjugated polymer is an acetylene polymer.

18. The method of claim 17, wherein said acetylene polymer is polyacetylene.

19. The method of claim 13, wherein said conjugated polymer is in the form of a film.

20. The method of claim 13, wherein said cationic dopant species is a metallic cation of a metal whose Pauling electronegativity value is no greater than 1.6.

21. The method of claim 20, wherein said metallic cation is an alkali metal cation.

22. The method of claim 13, wherein said electrochemical cell is an electrolytic cell.

23. The method of claim 22, wherein the operation of said electrolytic cell is carried out at an applied voltage and for a period of time which, in combination, are sufficient to convert said electrolytic cell into a charged secondary battery.

24. The method of claim 23, wherein said dopable conjugated polymer initially is in a substantially undoped state and becomes doped to its final doped state solely via operation of said electrolytic cell.

25. The method of claim 23, wherein said electrolyte is employed in an amount in excess of that required for effecting the doping operation, whereby the unspent portion thereof constitutes the electrolyte of the resulting charged secondary battery.

26. The method of claim 23, wherein said anode means includes as an anode-active material a conjugated polymer which is characterized by having conjugated unsaturation along a main backbone chain thereof and which is dopable with an anionic dopant species to a more highly electrically conducting state; said ionizable compound is ionizable also into said anionic dopant species; and the operation of said electrolytic cell simultaneously effects an increase in the oxidation state of said anode-active conjugated polymer, whereby said anode-active conjugated polymer simultaneously becomes doped with said anionic dopant species to a more highly electrically conducting state.

27. The method of claim 26, wherein said ionizable compound is an alkali metal halide or perchlorate.

28. The method of claim 26, wherein the anode-active conjugated polymer and the cathode-active conjugated polymer are opposite surfaces of the same unitary mass of conjugated polymer, and said electrolyte is impregnated within said conjugated polymer.

* * * * *

UNITED STATES PATENT AND TRADEMARK OFFICE
CERTIFICATE OF CORRECTION

PATENT NO. : 4,321,114
DATED : March 23, 1982
INVENTOR(S) : Alan G. MacDiarmid, et al.

It is certified that error appears in the above—identified patent and that said Letters Patent is hereby corrected as shown below:

Column 19, Line 46, "85" should read -- 1 -- .

Signed and Sealed this

Seventeenth Day of August 1982

[SEAL]

Attest:

Attesting Officer

GERALD J. MOSSINGHOFF
Commissioner of Patents and Trademarks